Sept. 23, 1958 J. H. FELKER 2,853,629

REGENERATIVE TRANSISTOR PULSE AMPLIFIER

Filed Aug. 27, 1953 2 Sheets-Sheet 1

INVENTOR
J. H. FELKER
BY N S Ewing
ATTORNEY

INVENTOR
J. H. FELKER
BY N. S. Ewing
ATTORNEY

United States Patent Office 2,853,629

Patented Sept. 23, 1958

2,853,629

REGENERATIVE TRANSISTOR PULSE AMPLIFIER

Jean H. Felker, Livingston, N. J., assignor to Bell Telephone Laboratories, Incorporated, New York, N. Y., a corporation of New York Application August 27, 1953, Serial No. 376,923

15 Claims. (Cl. 307—88.5)

This invention relates generally to transistor pulse amplifiers and more particularly, although not exclusively, to transistor pulse amplifiers suitable for use in high-speed switching systems and computers.

One object of the invention is to increase the amplitude of the output pulses obtainable from a regenerative transistor pulse amplifier.

Another object is to decrease the "clock" power required by a single-transistor regenerative pulse amplifier.

Still another object of the invention is to free the output pulses produced by a regenerative transistor pulse amplifier from dependence upon the previous history of the circuit and insure that all have the same amplitude and shape.

A further object is to increase the operating efficiency of a single-transistor regenerative pulse amplifier.

In high-speed pulse-operated switching systems and digital computers, it is advantageous to have a regenerative pulse amplifier of such general applicability that the same basic amplifier can be used to restore pulse amplitude and to standardize pulse duration wherever such functions are required. Since semiconductor diodes have found widespread use in such systems, transistor circuits find ready application as gain producing units in view of the similarity in the impedance levels and the current and voltage ratings of transistors and semiconductor diodes.

A simple regenerating transistor pulse amplifier suitable for general application in high-speed switching systems and digital computers is disclosed in the present inventor's copending application Serial No. 255,043, filed November 6, 1951 (United States Patent 2,670,445, issued February 23, 1954). The present invention represents a substantial improvement thereof, particularly from the standpoint of increased output pulse amplitude and decreased "clock" power requirements.

In its principal aspects, the invention takes the form of a single-transistor transformer-coupled regenerative pulse amplifier in which use of an output transformer in the collector circuit of the transistor is made possible by a special emitter biasing circuit. The amplifier is triggered to a quasi-stable high current state by signal pulses applied to the transistor emitter electrode during pulsing intervals and is reset to its stable low current state by regular "clock" pulses applied to the transistor base during interdigit intervals.

The emitter biasing circuit featured by the present invention safeguards the transistor in the event of momentary "clock" failure and includes a pair of series connected but oppositely poled semiconductor diodes returned from the emitter to a first direct potential, a first resistance returned from the emitter to the second direct potential and a second resistance connected from the junction between the two diodes to the second direct potential. The semi-conductor diode adjacent the transistor emitter electrode is poled in the direction of positive emitter current flow. The two direct potentials mentioned are chosen so that one is above and the other is below the quiescent level of the transistor base and are generally of opposite polarity.

A more complete understanding of the invention may be secured by a study of the following brief discussion of the prior art and description of a specific embodiment. In the drawings.

Figures 1, 1A, 2, 2A:
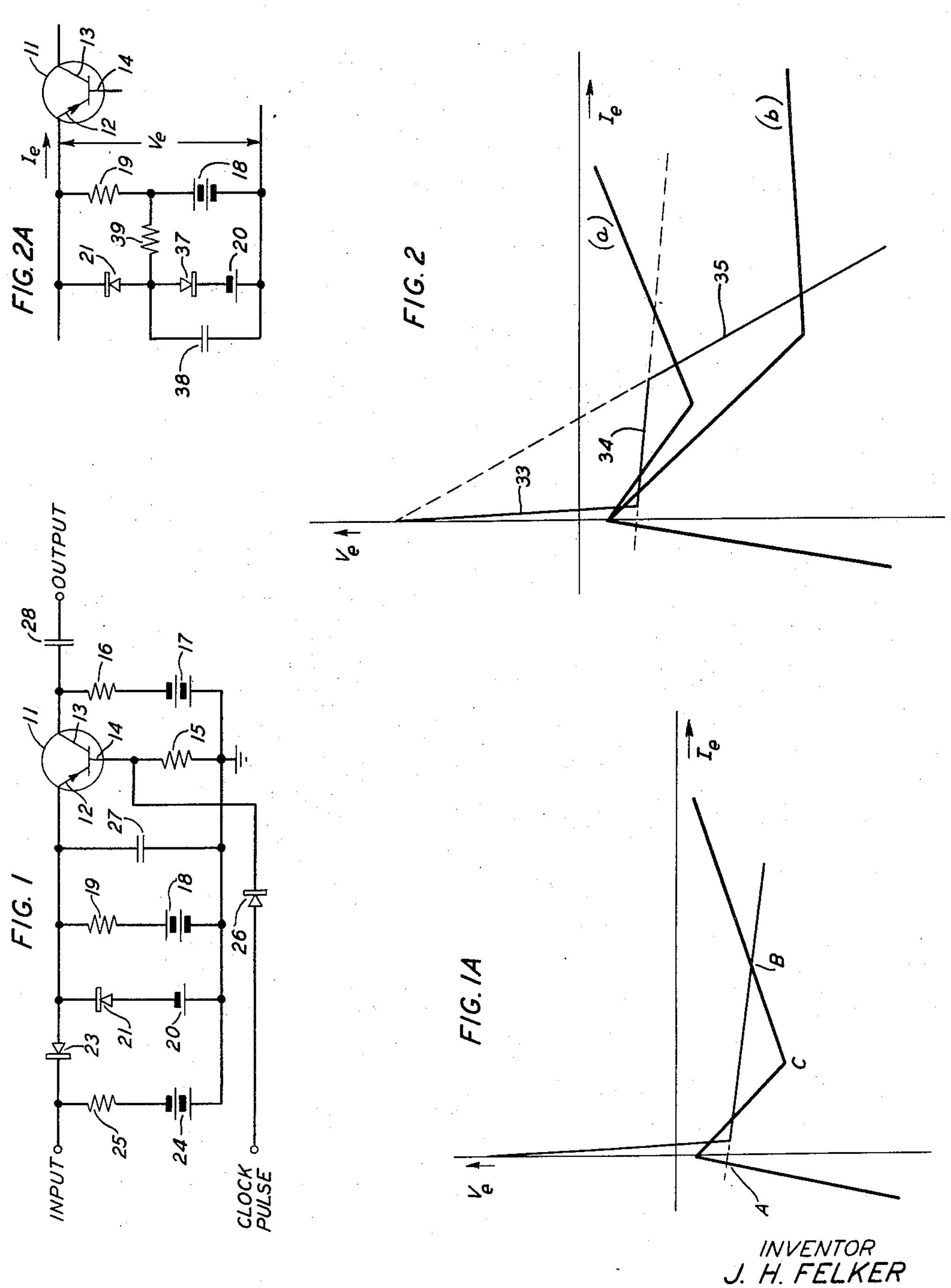
Fig. 1 is a circuit diagram of the regenerative transistor pulse amplifier disclosed in the above-mentioned copending application.
Fig. 1A illustrates the emitter voltage versus emitter current characteristic and the emitter load-line of the circuit shown in Fig. 1.
Fig. 2 illustrates emitter voltage versus emitter current characteristics encountered in a transformer-coupled regenerative transistor pulse amplifier and the emitter load-line featured by the present invention.
Fig. 2A is a circuit diagram of the emitter biasing circuit featured by the invention.

The prior art regenerative transistor pulse amplifier illustrated in Fig. 1 comprises a single transistor flip-flop circuit which is triggered to its high current state by signal pulses fed to the transistor emitter during pulsing intervals and is reset to its low current state by regular pulses fed to the transistor base during interdigit intervals. The transistor 11 possesses an emitter electrode 12, a collector electrode 13, and a base electrode 14. In the conventional symbol, the emitter is indicated by the arrow and the direction of positive emitter current flow is indicated by the direction of the arrow. Thus, a point-contact transistor having an n-type semiconductive body is indicated by a symbol in which the emitter arrow points toward the base, while one having a p-type body is indicated by the symbol in which the emitter arrow points away from the base. For convenience in this and successive figures, the conventional transistor symbol has the emitter arrow pointing toward the base, and all battery and rectifier polarities are chosen for the indicated direction of positive emitter current flow. The illustrated circuits are not, however, limited to any particular type of transistor. For positive emitter current flow in the opposite direction, all battery and rectifier polarities are reversed from those shown in the drawings.

In Fig. 1, a base resistor 15 is connected between the base of the transistor 11 and ground, while a load resistor 16 is returned from the collector to a negative voltage, conventionally represented by battery 17, which serves to bias the collector in the so-called reverse direction. The emitter is returned to a positive potential, represented by battery 18, through a "load-line" resistor 19, the resistance of which is large in comparison with the internal emitter resistance of transistor 11. In addition, the emitter is returned to a small negative potential, represented by battery 20, through a semiconductor diode 21 which is poled in the direction of positive emitter current flow. Signal input pulses are applied to the emitter of transistor 11 through a semiconductor diode 23 poled oppositely to the direction of positive emitter current flow, and the input side of diode 23 is returned to a negative potential, represented by battery 24, through another large resistor 25. Output pulses are taken from the collector and reset "clock" pulses are applied to the base through a semiconductor diode 26 which is poled for easy current flow toward that electrode. A bypass condenser 27 is connected between the emitter electrode of transistor 11 and ground, and a coupling condenser 28 is connected in the signal output path leading from the collector.

A detailed description of the operation of the regenerative pulse amplifier shown in Fig. 1 is contained in the previously mentioned copending application. A brief description of that operation is included here, however, as an aid in understanding the present invention, an embodiment of which will be described in due course.

A somewhat idealized emitter voltage versus emitter current characteristic for the transistor circuit shown in Fig. 1 appears as the heavy N-shaped curve in Fig. 1A. The L-shaped load line shown as the lighter curve is fixed by resistor 19, diode 21, and batteries 18 and 20. The slope of the nearly vertical portion of the load line is the resistance of resistor 19, and the intercept on the vertical axis is the voltage of battery 18. The slope of the nearly horizontal load line, on the other hand, is the forward resistance of diode 21, and its intercept on the vertical axis, if extended, is the voltage of battery 20.

Ignoring for the present the "clock" pulses applied to the base of transistor 11 by way of diode 26, the circuit will be considered in its "off" state. With the input terminal floating, conduction through diodes 23 and 21 and resistor 19 will hold the emitter at a negative potential. This operating point is point A on the idealized emitter characteristic shown in Fig. 1A. In this region, the emitter current is negligible.

An input pulse has the effect of raising the voltage at the input terminal by supplying current to resistor 25, thus shutting off diode 23. Deprived of its conducting path, diode 21 also ceases to conduct, thus allowing the emitter to rise toward the positive potential supplied by battery 18 as fast as the emitter capacitor 27 can be charged through resistor 19. When the emitter voltage rises above the peak point of the emitter voltage versus emitter current characteristic, however, the transistor enters its negative resistance region and starts to conduct, pulling the emitter voltage negative until diode 21 conducts once again. The emitter then moves out along line AB to point B, which is a stable high current operating point.

During the emitter transition from cut-off to saturation, the collector current also progresses from cut-off to saturation, giving positive feedback across the base resistance both external and internal to the transistor. The transistor will remain stably locked in the high current state by conduction into the emitter through diode 21 and into the base through resistor 15. The sum current coming out of the collector terminal divides between the output capacitor 28 and the load resistor 16, across which the output voltage pulse is developed. After the transistor is turned "on" the original signal pulse is unnecessary and may be removed.

In order to shut off the transistor, the entire emitter voltage versus emitter current characteristic is raised until line AB is below point C, the valley point. When this occurs, the operating point snaps to a low current state and the transistor turns off. It is then permissible to lower the emitter characteristic back to its original position, which sets the operating point at A.

The apparent shift in the emitter characteristic is accomplished by applying a positive "clock" pulse to the base. In practice, a sine wave is applied through diode 26, which clips off the negative half cycle.

The input pulse actually arrives while the base is still positive and serves to prepare the emitter for firing by charging up the emitter capacitor 27. When the base returns to ground, the transistor fires immediately, to be turned off when the base voltage goes positive again. In this manner, the output pulse is precisely set in starting time and duration.

The following set of circuit values may be taken as typical for the regenerative transistor pulse amplifier illustrated in Fig. 1:

| | |
|---|---|
| Transistor **11** | M1734 point-contact type. |
| Resistor **15** | 470 ohms. |
| Resistor **16** | 470 ohms. |
| Battery **17** | −8 volts. |
| Battery **18** | +6 volts. |
| Resistor **19** | 22,000 ohms. |
| Battery **20** | −1 volt. |
| Battery **24** | −8 volts. |
| Resistor **25** | 12,000 ohms. |
| Condenser **27** | 15 micromicrofarads. |
| Condenser **28** | 0.01 microfarad. |

A one-megacycle sine wave is applied to the base of transistor 11 through diode 26 to form the "clock" pulses which reset the transistor to its low current state during inter-digit intervals.

A disadvantage of the resistance-capacitance coupled regenerative pulse amplifier shown in Fig. 1 is the loss of power in load resister 16. The efficiency of the resistance-capacitance output circuit is given approximately by the ratio of the current delivered to the load to the total current drawn from the collector. Since load resistor 16 is relatively small, it draws a relatively large proportion of the available collector current and the efficiency tends to be low.

The obvious remedy, increasing the value of collector resistor 16, is not practical for two reasons. It is necessary to maintain a low impedance at the collector to facilitate triggering and, more important, it is necessary to provide a low resistance path from battery 17 to the coupling capacitor 28. This last consideration stems from another disadvantage of a resistance-capacitance coupled circuit.

When an attempt is made to feed single polarity digit pulses through a coupling capacitor, the capacitor attains a charge during the pulse time that is not fully removed in the interdigit time. Even with a clamping diode at the output, the switch in transistor impedance from the "on" to the "off" state is such that a net charge per digit is deposited on the coupling capacitor, resulting in a decay in pulse amplitude with a long series of pulses. The amplitude above the average level of the last pulse in a long chain of pulses is approximately one half the amplitude of the first pulse. A lack of pulse amplitude standardization is particularly objectionable in a computer.

Although a low load impedance is desired for triggering, it is undesirable for turning off a transistor. The clock wave form applied to the base sees the load resistance in series with the collector resistance as a load. In the example given, the total is a rather low impedance load of the order of 500 ohms. To aggravate the situation, the so-called "hole storage" or "enhancement" phenomenon maintains the collector impedance at a low value until the minority carriers at the collector are completely neutralized. The number of such carriers is directly dependent upon the saturated collector current, which must be made high when the load resistance is low in order to produce a sufficient output voltage.

Among other things, the present invention features a transformer output circuit in a pulse amplifier of the type shown in Fig. 1 in place of the resistance-capacitance circuit. Primarily, a transformer output circuit is desirable from the standpoint of efficiency in transferring power to the load. Present-day ferrite pulse transformers have efficiencies in excess of 80 percent and occupy a remarkably small volume.

In the transformer coupled circuit the time constant is $L/R$, where L is the inductance and R the resistance of the transformer primary. Since R is low when the transistor is conducting and is high during the interdigit period when the transistor is cut off, the time constant of the coupling circuit is long when the pulse is being transmitted through it and is short in the interdigit period. Thus the energy stored in the inductance of the transformer is dissipated in the interdigit period because of the short time constant. Each output pulse therefore is independent of the previous history of the circuit and all pulses have the same amplitude and shape.

Since there is no necessity for a low load resistor, the collector sees only the impedance of the load it is driving. A typical load in a digital computer system is of the order of 800 ohms, giving a substantial increase in pulse amplitude over that of the resistance-capacitance coupled circuit.

Looking in at the base, a high impedance in series with the collector facilitates turning off the transistor. Enhancement must still be dealt with, however, since it is a property of the semiconductor itself. When a transformer output is used, the enhancement effect is reduced because the high collector impedance limits collector current during "on" time.

A transformer coupled output circuit is not, however, readily applicable to a regenerative pulse amplifier of the type shown in Fig. 1. Since the resistance of a pulse transformer winding is negligible, an amplifier circuit using such an output which has been turned "on" must be turned "off" before the inductance in the collector circuit builds up its current to the extent that it appears as a short-circuit. Although the inductive time constant in the collector circuit is set to be long compared to the pulse duration in normal operation, an absence of the clock voltage will allow this condition to occur. This may be illustrated in connection with Fig. 2 of the drawings.

In Fig. 2 there appear two heavy N-shaped emitter voltage versus emitter current curves corresponding to the N-shaped curve in Fig. 1A. The first of these, curve *a*, is the emitter characteristic with 470 ohms in the transistor base circuit and 800 ohms in the collector circuit, while the second, curve *b*, is the emitter characteristic for 470 ohms in the base circuit and zero resistance in the collector circuit.

With the emitter biasing circuit of Fig. 1, the emitter load-line is like that illustrated in Fig. 1A and appears in Fig. 2 as a nearly vertical portion 33 and a nearly horizontal portion 34, with the latter portion extending indefinitely in the direction indicated by the dashed line extension of 34. The slope of the right-hand portion of the emitter load-line is the forward resistance of diode 21 and its high current intersection with the emitter characteristic defines the static high current operating point. As shown in Fig. 2, this point occurs at a reasonable current for emitter characteristic (*a*) but at a dangerously high current for emitter characteristic (*b*). It is highly probable that a clock failure for even a few microseconds would destroy the transistor if a transformer output circuit were applied to the prior art amplifier without changing the emitter biasing circuit.

The present invention features a modification of the diode 21 portion of the load-line to eliminate this danger. A partial circuit diagram of an embodiment of the invention illustrating the manner of accomplishing this modification appears in Fig. 2A. There, transistor 11, battery 18, resistor 19, battery 20, and diode 21 are as shown in Fig. 1. They are supplemented, however, by the addition of a semiconductor diode 37, poled oppositely from diode 21, connected between diode 21 and battery 20, a capacitor 38 returned from the junction between diodes 21 and 37 to ground, and a resistor 39 returned from that same junction to the positive terminal of battery 18. The following circuit parameters may be taken as typical for the additional elements shown in Fig. 2A:

| | |
|---|---|
| Condenser 38 | 300 micromicrofarads. |
| Resistor 39 | 2700 ohms. |

The emitter biasing circuit shown in Fig. 2A provides a third portion 35 to the emitter load-line shown in Fig. 2. Diode 37, condenser 38, and resistor 39 furnish a high impedance source for diode 21. Ignoring condenser 38 for the moment, conduction through diode 37 and resistor 39 will hold diode 21 shut off when the emitter voltage is positive. The transistor emitter then sees only resistor 19 connected to battery 18 as a current source. As emitter conduction increases, emitter voltage drops until diode 21 begins to conduct in the forward direction. Increased conduction in the emitter transfers current from diode 37 to diode 21 until diode 21 takes all the current coming through resistance 39. Further current demands depress the voltage at the low potential end of resistance 39, shutting off diode 37. In this region, the emitter sees resistance 39 and diode 21 in parallel with resistance 19 as its source impedance, the parallel combination being equivalent to a single resistor of approximately 2400 ohms. The modified emitter load-line shown solid in Fig. 2 provides a sharp intersection with both emitter characteristics A and B, thus providing a reasonable operating current under all conditions.

The dynamic load-line differs from the static load-line due to the presence of condenser 38, which offers a relatively low impedance current source for diode 21 for fast changes in emitter voltage, but the foregoing analysis is sufficient, nevertheless, to explain the principles underlying this feature of the invention.

Figure 3:
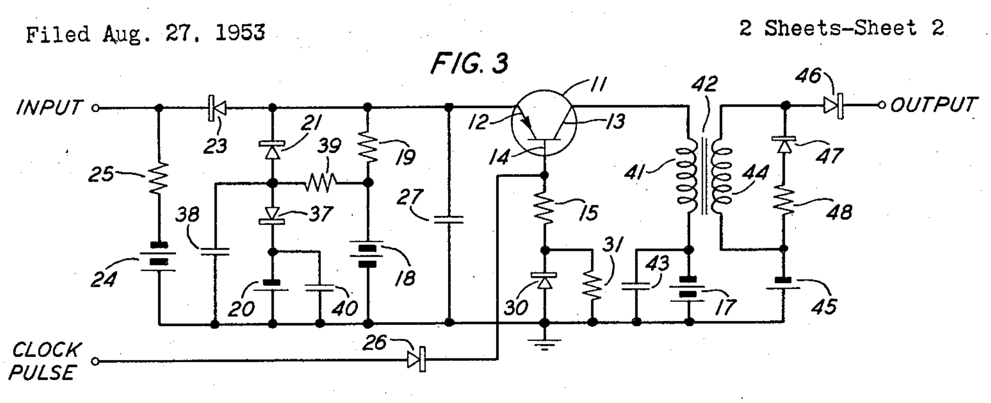
Fig. 3 is a full circuit diagram of a specific embodiment of the present invention.

A schematic diagram of a specific embodiment of the present invention is shown in Fig. 3. The illustrated amplifier is generally similar to the prior art circuit shown in Fig. 1 but incorporates both a transformer coupled output circuit and the emitter biasing circuit shown in Fig. 2A. In addition, a semiconductor diode 30, poled for easy current flow toward the base electrode of transistor 11, is connected in series between base resistor 15 and ground to present a high impedance when the transistor base is driven positive by the clock pulses and to present a low impedance when the transistor is triggered. Diode 30 is shunted by a resistor 31 to provide a path for discharging stray capacitances.

As in Fig. 1, in the embodiment of the invention shown in Fig. 3, a resistor 25 is returned from the signal input terminal to a negative potential, represented by battery 24, and a semiconductor diode 23 poled oppositely from the direction of positive emitter current flow is coupled between the signal input terminal and the emitter electrode of transistor 11. Additionally, a bypass condenser 27 is connected between the emitter of transistor 11 and ground.

The emitter biasing circuit in Fig. 3 is composed of resistor 19 returned from the emitter to a positive potential, represented by battery 18, diodes 21 and 37 in series returned to a negative potential, represented by battery 20, condenser 38 returned to ground from the junction between diodes 21 and 37, and resistor 39 returned to the positive side of battery 18 from the junction between diodes 21 and 37. Diodes 21 and 37 are oppositely poled, with the former poled for easy current flow in the direction of positive emitter current flow. A bypass condenser 40 is connected in parallel with battery 20.

Clockpulses are supplied directly to the transistor base electrode during interdigit intervals through diode 26 in the manner shown in Fig. 1. However, as mentioned above, in Fig. 3 the collector circuit of the transistor 11 is different. In the embodiment of the invention illustrated in Fig. 3, the primary winding 41 of an output pulse transformer 42 is connected between the collector electrode of transistor 13 and the negative pole of battery 17. Battery 17 is in turn bypassed to ground by a condenser 43. Output pulses are taken from a secondary winding 44 of transformer 42.

The low potential side of secondary winding 44 is returned to a small negative voltage, conventionally represented by battery 45. The internal resistances of the transistor in the low current state form a voltage divider from the base to the collector in which a small proportion of the clock voltage applied to the base appears across the collector load impedance. This proportion is negligibly small with the low load impedance of the resistance-capacitance coupled circuit of the prior art, but becomes important with the new higher impedance collector load. The ripple amounts to about 0.5 volt peak at worst and makes it necessary to bias the output wave form slightly negatively to avoid any possibility of triggering the next stage falsely.

A semiconductor diode 46, poled toward the output terminal of the amplifier, is connected between the high potential end of winding 44 and the amplifier output terminal to prevent the overshoot that appears across the transformer in the interdigit period from appearing at the output. Another diode 47 and a resistor 48 are connected in series directly across winding 44, with diode 47 poled for easy current flow toward diode 46.

The operation of the embodiment of the invention illustrated in Fig. 3 is substantially the same as that of the prior art regenerative pulse amplifier shown in Fig. 1 in that signal pulses applied to the transistor emitter electrode trigger the circuit to its high current state and clock pulses applied to the transistor base during interdigit intervals reset it to its low current state. In Fig. 3, however, the circuit locks up through diode 21 and resistor 39, thereby limiting the current available from the emitter source. Were it not for the very low transient impedance of condenser 38, this limitation of emitter current would necessitate a slow rise of collector voltage as the collector capacity charged. Condenser 38, however, makes possible the fast collector voltage rise required in digital computer operations.

It is of interest to note that while the amplifier of Fig. 1 is composed principally of a single transistor flip-flop circuit, the embodiment of the invention shown in Fig. 3 is not. The circuit in Fig. 3 is only quasi-stable in its high current state. If a base pulse did not occur after a long "on" time (e. g., 2.0 microseconds), the collector would be essentially short-circuited through the inductance of transformer 42 and the operating point would descend to the valley point on the emitter characteristic for zero collector resistance (curve *b* of Fig. 2). If this intersection is in the negative resistance region, as it may be for some transistors, then the state will not be stable.

Typical circuit parameters for the embodiment of the invention illustrated in Fig. 3 are as follows:

| | |
|---|---|
| Transistor **11** | M1735 point-contact type. |
| Resistor **15** | 470 ohms. |
| Battery **17** | −8 volts. |
| Battery **18** | +6 volts. |
| Resistor **19** | 22,000 ohms. |
| Battery **20** | −2 volts. |
| Battery **24** | −8 volts. |
| Resistor **25** | 12,000 ohms. |
| Condenser **27** | 15 micromicrofarads. |
| Resistor **31** | 2,000 ohms. |
| Condenser **38** | 300 micromicrofarads. |
| Resistor **39** | 27,000 ohms. |
| Condenser **40** | 0.01 microfarad. |
| Transformer **42** | 1:1 turns ratio. |
| Condenser **43** | 0.01 microfarad. |
| Battery **45** | −2 volts. |
| Resistor **48** | 2000 ohms. |

The total power supplied to the regenerative pulse amplifier of Fig. 3 from all sources including the clock source is in the vicinity of 50 milliwatts. Slightly more than half of this power is dissipated in the emitter circuit in resistor 39. This resistor may be replaced by a constant back current diode connected to some low voltage with a considerable saving in power dissipation. Even without this change, however, the heat generated in the vicinity of the transistor may be readily removed without a dangerous temperature rise.

More important than the total power required by the circuit is the power required of the clock source. The difficulties inherent in the generation of high power at one megacycle with precisely controlled phase at all points speak for themselves.

Current drawn from the clock source will flow into the transistor base itself as well as through the base circuit. The current flowing in the base circuit resistor 15 will dissipate in average power of $$P=\frac{(E_{max})^2}{2R_b}\cong 30 \text{ milliwatts}$$

during each positive-going half cycle when the clock voltage is a sine wave of 12 volts peak and the base resistance $R_b$ is 2500 ohms. If the transistor had not been turned on $$\frac{30}{2}=15 \text{ milliwatts}$$

would be the total power supplied by the clock source. When the transistor has been turned "on," however, clock current flows through the transistor in the collector circuit. In theory, the transistor will again enter its active gain region and return to its low current state when a fictitious internal node is driven positive with respect to the emitter. This node is considered to be a voltage divider from base to collector with the turn-off voltage developed across the collector branch. "Carrier storage" in this branch requires that a current be supplied through the base to the collector region for a time sufficient to clear out the "stored" carriers. The magnitude and duration of the current depends upon the particular transistor and the magnitude and duration of previous conduction. In the transformer coupled circuit embodying the present invention, conduction in the "on" state is low compared with that in the resistance-capacitance coupled prior art circuit, as is evidenced by a comparison of the "on" state operating points. This results in a lower clock power requirement.

As will be apparent from a consideration of the foregoing description of a specific embodiment of the invention and comparison between its operating characteristics and those of the prior art device, a new regenerative pulse amplifier has been devised at the cost of but a slight increase in complexity and number of components. The advantages that have accrued in the process include: (1) improved amplitude of output pulse; (2) no dependence of pulse amplitudes on previous history; (3) greater efficiency resulting in increased load capacity; and (4) decreased clock power requirement.

Figure 3A:
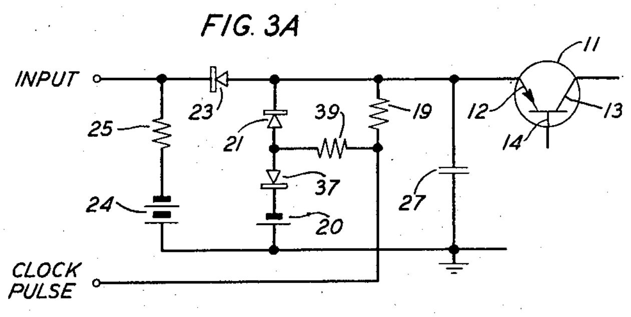
Figs. 3A, 3B and 3C are circuit diagrams of alternative "clock" feed systems for embodiments of the invention.
Figure 3B:
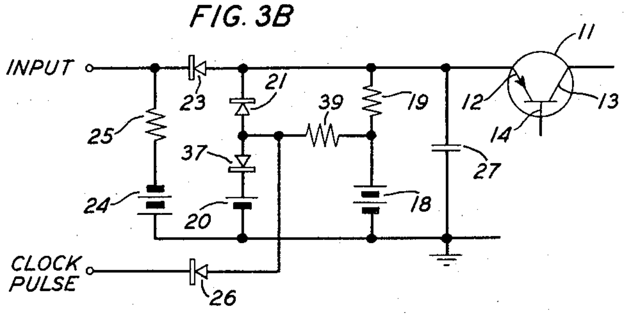
Figure 3C:
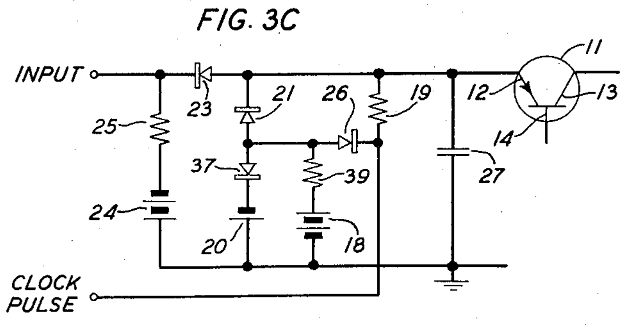

A number of alternative arrangements for applying the clock voltage to the amplifier shown in Fig. 3 are illustrated in Figs. 3A, 3B, and 3C. All of these arrangements feature clock voltage fed to the transistor emitter circuit, as opposed to the base circuit, at a somewhat reduced power level.

A system which may be termed a semi clock-powered system is illustrated in Fig. 3A, where resistor 19 is connected to the clock source instead of positive voltage source 18 and resistor 39 is connected from the junction between diodes 21 and 37 to the clock source. Diode 26 is eliminated from the clock lead. A study of Fig. 2 reveals the principle of operation. The entire load line is shifted up and down with respect to the emitter characteristic by variation of the voltage to which resistors 19 and 39 are returned. The presence of stray capacity at the emitter may impose an undesirable condition, however, in delaying the triggering and uncontrollable length of time.

Assuming the input pulse has come in 0.25 microsecond before the clock pulse, the time at which emitter capacitor 27 reaches the peak point will depend upon the rise time of the clock voltage and the total value of the emitter to ground capacity, neither of which are readily subject to close control.

In the circuit shown in Fig. 3A, another difficulty may be encountered in that the transistor may be slow to shut off. This effect is a natural result of attempting to eliminate the clock current formerly sent into the collector circuit to help clear out the anomalous carriers. If these "stored" carriers are allowed to drift out under influence of the collector voltage only, the output pulse will be stretched by an amount dependent upon the transistor characteristic. Although only the first half of a digit pulse is useful, this effect is important because it shortens the interdigit recovery time.

The semi clock-powered system illustrated does reduce clock power to some 10 or 15 milliwatts and may be particularly useful where the pulse length is longer than 0.5 microseconds.

A load-line switching system for the application of clock power to the transistor emitter circuit is illustrated in Fig. 3B. There, the emitter biasing circuit is substantially the same as in Fig. 3, with the exception that the clock lead is connected to the junction between diodes 21 and 37. In addition, diode 26 is poled away from the junction toward the clock terminal. However, the portion of the load-line in Fig. 2 provided by diode 21 is shifted downward by the negative-going clock voltage, leaving only the nearly vertical portion of the load-line provided by resistor 19 which intersects the emitter characteristic very close to the voltage axis.

When the clock voltage swings negative and the transistor has been locked in the high current state, the operating point swings negative until it passes the valley point, at which time the transistor turns off. If the transistor has been in the "on" state, the operating point moves in the negative direction along the emitter characteristic until the emitter voltage is about −3 volts, at which point diode 21 cuts off. A particularly desirable feature of this system is the low clock voltage required. It is subject, however, to the slow turn-off in the collector mentioned in connection with Fig. 3A.

In the circuit of Fig. 3B, however, a fundamental difficulty occurs at triggering because the input pulse can trigger the transistor even though the clock voltage is negative by simply carrying the input positive enough to shut off diode 23. This automatically turns off diode 21, allowing the emitter voltage to rise. While the transistor cannot lock up in the "on" state as long as the clock is negative, the resulting relaxation oscillation may preclude use of this circuit to save clock power.

A composite of the clock supply arrangement shown in Figs. 3A and 3B appears in Fig. 3C. It uses somewhat higher clock power than the semi clock-powered system of Fig. 3A but eliminates the relaxation oscillation due to the input pulse preceding the clock zero crossing to which the load line switching system of Fig. 3B is subject. Triggering time is, however, dependent upon the value of the stray emitter capacity.

Fig. 3C is like Fig. 3A except that resistor 39 is returned to battery 18 instead of to the clock source, and diode 26 is connected from the junction of diodes 21 and 37 and resistor 39 to the low potential side of resistor 19. Diode 26 is poled for easy current flow from the junction toward the low potential side of resistor 19.

In general, however, none of the alternative clock input systems outlined above is superior to the arrangement shown in Fig. 3A, in which the clock input is applied to the transistor base. Introduction of the clock wave form at this point provides the most precise timing of the rise and fall of the output pulse.

It is to be understood the above-described arrangements are illustrative of the application of the principles of the invention. Numerous other arrangements may be devised by those skilled in the art without departing from the spirit and scope of the invention.

What is claimed is:

1. A regenerative pulse amplifier which comprises, in combination, a transistor having an emitter electrode, a collector electrode, and a base electrode, a first circuit path having two parallel branches interconnecting said emitter and base electrodes, a second circuit path interconnecting said collector and base electrodes, a base resistance common to said second circuit path and both branches of said first circuit path, an output transformer having a primary winding connected in said second circuit path in serial relation with said base resistance, a first resistance connected in the first branch of said first circuit path between said emitter electrode and said base resistance, first and second oppositely poled asymmetrically conducting devices connected in series in the second branch of said first circuit path between said emitter electrode and said base resistance with said first device adjacent said emitter electrode, said first device being poled in the direction of positive emitter current flow, a second resistance connected from the junction between said first and second devices to the side of said first resistance remote from said emitter electrode, circuit means to supply signal pulses to said emitter electrode during predetermined pulsing intervals to trigger said transistor to a high emitter current state, and circuit means to supply a succession of pulses to said base electrode to reset said transistor to a low emitter current state during interdigit intervals.

2. A regenerative pulse amplifier which comprises, in combination, a transistor having an emitter electrode, a collector electrode, and a base electrode, a first circuit path having two parallel branches interconnecting said emitter and base electrodes, a second circuit path interconnecting said collector and base electrodes, a base resistance common to said second circuit path and both branches of said first circuit path, an output transformer having a primary winding connected in said second circuit path in serial relation with said base resistance, a first resistance and a first source of direct potential connected in series in the first branch of said first circuit path between said emitter electrode and said base resistance with said first resistance adjacent said emitter electrode, first and second oppositely poled asymmetrically conducting devices and a second source of direct potential connected in series in the second branch of said first circuit path between said emitter electrode and said base resistance with said first device adjacent said emitter electrode and said second device intermediate said first device and said second source, said first device being poled in the direction of positive emitter current flow, a second resistance connected from the junction between said first resistance and said first source to the junction between said first and second devices, the equiescent direct voltage level of said base electrode being between the respective direct potentials supplied by said first and second sources, circuit means to supply signal pulses to said emitter electrode during predetermined pulsing intervals to trigger said transistor to a high emitter current state, and circuit means to supply a succession of pulses to said base electrode to reset said transistor to a low emitter current state during interdigit intervals.

3. A regenerative pulse amplifier which comprises, in combination, a transistor having an emitter electrode, a collector electrode, and a base electrode, a first circuit path having two parallel branches interconnecting said emitter and base electrodes, a second circuit path interconnecting said collector and base electrodes, a base resistance common to said second circuit path and both branches of said first circuit path, an output transformer having a primary winding connected in said second circuit path in serial relation with said base resistance, a first resistance and a first source of direct potential connected in series in the first branch of said first circuit path between said emitter electrode and said base resistance with said first resistance adjacent said emitter electrode, said first source being poled to bias said emitter electrode in the forward direction, first and second oppositely poled asymmetrically conducting devices and a second source of direct potential connected in series in the second branch of said first circuit path between said emitter electrode and said base resistance with said first device adjacent said emitter electrode and said second device intermediate said first device and said second source, said first device being poled in the direction of positive emitter current flow, and said second source being poled to bias said emitter electrode in the reverse direction, a second resistance connected from the junction between said first resistance and said first source to the junction between said first and second devices, circuit means to supply signal pulses to said emitter electrode during predetermined pulsing intervals to trigger said transistor to a high emitter current state, and circuit means to supply a succession of pulses to said base electrode to reset said transistor to a low emitter current state during interdigit intervals.

4. A regenerative pulse amplifier in accordance with claim 3 which includes a bypass capacitor connected in shunt with said second asymmetrically conducting device and said second source of direct potential to permit rapid collector voltage rise each time said transistor is triggered to its high emitter current state.

5. In combination with a transistor, an emitter biasing circuit which comprises first and second parallel circuit paths interconnecting the emitter and base electrodes of the transistor, a first resistance connected in said first circuit path, first and second oppositely poled asymmetrically conducting devices connected in series in said second circuit path with said first device adjacent the emitter electrode, said first device being poled in the direction of positive emitter current flow, and a second resistance connected from the junction between said first and second devices to the side of said first resistance remote from the emitter electrode.

6. In combination, a transistor having an emitter electrode, a collector electrode, and a base electrode, a first circuit path having two parallel branches interconnecting said emitter and base electrodes, a second circuit path interconnecting said collector and base electrodes, a base resistance common to said second circuit path and both branches of said first circuit path, a first resistance connected in the first branch of said first circuit path between said emitter electrode and said base resistance, first and second oppositely poled asymmetrically conducting devices connected in series in the second branch of said first circuit path between said emitter electrode and said base resistance with said first device adjacent said emitter electrode, said first device being poled in the direction of positive emitter current flow, and a second resistance connected from the junction between said first and second devices to the side of said first resistance remote from said emitter electrode.

7. In combination, a transistor having an emitter electrode, a collector electrode, and a base electrode, a first circuit path having two parallel branches interconnecting said emitter and base electrodes, a second circuit path interconnecting said collector and base electrodes, a base resistance common to said circuit path and both branches of said first circuit path, a first resistance and a first source of direct potential connected in series in the first branch of said first circuit path between said emitter electrode and said base resistance with said first resistance adjacent said emitter electrode, first and second oppositely poled asymmetrically conducting devices and a second source of direct potential connected in series in the second branch of said first circuit path between said emitter electrode and said base resistance with said first device adjacent said emitter electrode and said second device intermediate said first device and said second source, said first device being poled in the direction of positive emitter current flow, and a second resistance connected from the junction between said first resistance and said source to the junction between said first and second devices, the quiescent direct voltage level of said base electrode being between the respective direct potentials supplied by said first and second sources.

8. In combination, a transistor having an emitter electrode, a collector electrode, and a base electrode, a first circuit path having two parallel branches interconnecting said emitter and base electrodes, a second circuit path interconnecting said collector and base electrodes, a base resistance common to said second circuit path and both branches of said first circuit path, a first resistance and a first source of direct potential connected in series in the first branch of said first circuit path between said emitter electrode and said base resistance with said first resistance adjacent said emitter electrode, said first source being poled to bias said emitter electrode in the forward direction, first and second oppositely poled asymmetrically conducting devices and a source of direct potential connected in series in the second branch of said first circuit path between said emitter electrode and said base resistance with said first device adjacent said emitter electrode and said second device intermediate said first device and said second source, said first device being poled in the direction of positive emitter current flow and said second source being poled to bias said emitter electrode in the reverse direction, and a second resistance connected from the junction between said first resistance and said first source to the junction between said first and second devices.

9. In combination, a transistor having an emitter electrode, a collector electrode, and a base electrode, a first circuit path interconnecting said emitter and base electrodes, a second circuit path interconnecting said collector and base electrodes, a base resistance common to both of said circuit paths, whereby the emitter voltage-current characteristic of said transistor includes a region of negative resistance bounded by two regions of positive resistance, a first resistance in said circuit path connected between said emitter electrode and said base resistance providing a first emitter load line section for said transistor at low values of emitter current, first and second oppositely poled asymmetrically conducting devices in said circuit path connected in series between said emitter electrode and said base resistance substantially parallel with said first resistance with said first device adjacent said emitter electrode providing a second emitter load line section for said transistor at intermedite values of emitter current, said first device being poled in the direction of positive emitter current flow, and a second resistance in said first circuit path connected from the junction between said first and second devices to the side of said first resistance remote from said emitter electrode providing with said first resistance, a third emitter load line section for said transistor at high values of emitter current, whereby said first and third load line sections have slopes at least several times greater than the slope of said second load line section, said first and second load line sections intersecting said negative resistance region of said emitter voltage-current characteristic.

10. In combination, a transistor having an emitter electrode, a collector electrode, and a base electrode, a first circuit path interconnecting said emitter and base electrodes, a second circuit path interconnecting said collector and base electrodes, a base resistance common to both of said circuit paths, whereby the emitter voltage-current characteristic of said transistor includes a region of negative resistance bounded by two regions of positive resistance, a first resistance and a first source of direct potential in said first circuit path connected in series between said emitter electrode and said base resistance with said first resistance adjacent said emitter electrode providing a first emitter load line section for said transistor at low values of emitter current, first and second oppositely poled asymmetrically conducting devices and a second source of direct potential in said first circuit path connected in series between said emitter electrode and said base electrode substantially in parallel with said first resistance and first source, with said first device adjacent said emitter electrode and said second device intermediate said first device and said second source providing a second emitter load line section for said transistor at intermediate values of emitter current, said first device being poled in the direction of positive emitter current flow, and a second resistance in said first circuit path connected from the junction between said first resistance and said first source to the junction between said first and second devices providing with said first resistance a third emitter load line section for said transistor at high values of emitter current, whereby said first and third load line sections have slopes at least several times greater than the slope of said second load line section, the quiescent voltage level of said base electrode being between the respective direct potentials supplied by said first and second sources and said first and second load line sections intersecting said negative resistance region of said emitter voltage-current characteristic.

11. In combination, a transistor having an emitter electrode, a collector electrode, and a base electrode, a first circuit path interconnecting said emitter and base electrodes, a second circuit path interconnecting said collector and base electrodes, a base resistance common to both of said circuit paths, whereby the emitter voltage-current characteristic of said transistor includes a region of negative resistance bounded by two regions of positive resistance, a first resistance and a first source of direct potential in said first circuit path connected in series between said emitter electrode and said base resistance with said first resistance adjacent said emitter electrode providing a first emitter load line section for said transistor at low values of emitter current, said first source being poled to bias said emitter electrode in the forward direction, first and second oppositely poled asymmetrically conducting devices and a second source of direction potential connected in series in said first circuit path between said emitter electrode and said base resistance substantially in parallel with said first resistance and first source with said first device adjacent said emitter electrode and said second device intermediate said first device and said second source providing a second emitter load line section for said transistor at intermediate values of emitter current, said first device being poled in the direction of positive emitter current flow and said second source being poled to bias said emitter electrode in the reverse direction, and a second resistance in said first circuit path connected from the junction between said first resistance and said first source to the junction between said first and second devices providing with said first resistance a third emitter load line section for said transistor at high values of emitter current, said first and second load line sections intersecting said negative resistance region of said transistor emitter voltage-current characteristic.

12. A combination in accordance with claim 11 which includes a bypass capacitor connected in shunt with said second asymmetrical conducting device and second source of direct potential.

13. A combination in accordance with claim 11 in which said third load line section intersects the positive resistance region of said transistor emitter-voltage characteristic bounding said negative resistance region on the high current side.

14. A regenerative pulse amplifier which comprises, in combination, a transistor having an emitter electrode, a collector electrode, and a base electrode, a first circuit path interconnecting said emitter and base electrodes, a second circuit path interconnecting said collector and base electrodes, a base resistance common to both of said circuit paths, whereby the emitter voltage-current characteristic of said transistor includes a region of negative resistance bounded by two regions of positive resistance, an output transformer having a primary winding in said second circuit path in serial relation with said base resistance, circuit means in said first circuit path providing a first emitter load line section for said transistor at low values of emitter current, circuit means in said first circuit path providing a second emitter load line section for said transistor at intermediate values of emitter current, circuit means in said first circuit path providing a third emitter load line section for said transistor at high values of emitter current, said first and third load line sections having slopes at least several times greater than the slope of said second load line section and said first and second load line sections intersecting said negative resistance region of said transmitter voltage-current characteristics, circuit means to supply a signal pulse to said emitter electrode during predetermined pulsing intervals to trigger said transistor to a high emitter current state, and circuit means to supply a succession of pulses to said base electrode to reset said transistor to a low emitter current state during interdigit intervals.

15. A regenerative pulse amplifier in accordance with claim 14 in which said third load line section intersects the positive resistance region of said transistor emtter voltage-current characterstic bounding said negative resistance region on the high current side.

References Cited in the file of this patent

UNITED STATES PATENTS

| | | |
|---|---|---|
| 2,595,208 | Bangert | Apr. 29, 1952 |
| 2,556,286 | Meacham | June 12, 1953 |
| 2,644,893 | Gehman | July 7, 1953 |
| 2,657,308 | Brandt | Oct. 27, 1953 |